US008587759B2

(12) United States Patent
Kim

(10) Patent No.: US 8,587,759 B2
(45) Date of Patent: Nov. 19, 2013

(54) THIN FILM TRANSISTOR ARRAY PANEL HAVING IMPROVED FLICKER AND CROSS-TALK CHARACTERISTICS

(75) Inventor: Dong-Gyu Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/476,480

(22) Filed: May 21, 2012

(65) Prior Publication Data

US 2012/0229439 A1    Sep. 13, 2012

Related U.S. Application Data

(62) Division of application No. 12/507,731, filed on Jul. 22, 2009, now Pat. No. 8,208,082.

(30) Foreign Application Priority Data

Mar. 2, 2009 (KR) .......................... 10-2009-0017724

(51) Int. Cl.
*G02F 1/1333* (2006.01)
*G02F 1/1343* (2006.01)

(52) U.S. Cl.
USPC ............... 349/143; 349/39; 349/40; 349/141; 257/71; 315/169

(58) Field of Classification Search
USPC .......... 349/38–40, 141–143; 315/169; 257/71
See application file for complete search history.

(56) References Cited

U.S. PATENT DOCUMENTS

| 7,852,446 | B2 * | 12/2010 | Kim .............................. 349/143 |
| 7,855,757 | B2 | 12/2010 | Lee et al. |
| 7,855,758 | B2 | 12/2010 | Kim et al. |
| 7,858,974 | B2 | 12/2010 | Yoon et al. |
| 7,898,629 | B2 | 3/2011 | Ono et al. |
| 2008/0068524 | A1 * | 3/2008 | Kim .............................. 349/38 |
| 2009/0160879 | A1 * | 6/2009 | Tu et al. ........................ 345/690 |
| 2009/0262270 | A1 | 10/2009 | Kim et al. |
| 2010/0053490 | A1 | 3/2010 | Kang et al. |
| 2010/0149142 | A1 * | 6/2010 | Hsu et al. ...................... 345/205 |

\* cited by examiner

*Primary Examiner* — Huyen Ngo

(74) *Attorney, Agent, or Firm* — Innovation Counsel LLP

(57) ABSTRACT

A thin film transistor array panel, according to an embodiment of the present invention, includes a first data line, a second data line neighboring the first data line, a transistor disposed between the first data line and the second data line, and a pixel electrode disposed close to the second data line. An extension of the pixel electrode may cross the second data line, thereby being connected to the transistor. Accordingly, it may not be necessary to use an additional connecting member between the pixel electrode and the data line such that the process may be shortened and the structure of the wiring may be simplified. Also, spatial utility may be increased. Further transistors can be laid out in inversion symmetrical manner, with corresponding pixel electrode extensions crossing over respective data lines. This layout can be readily driven to reduce flicker and cross-talk.

7 Claims, 13 Drawing Sheets

THIN FILM TRANSISTOR ARRAY PANEL HAVING IMPROVED FLICKER AND CROSS-TALK CHARACTERISTICS

CROSS-REFERENCE TO RELATED APPLICATIONS

This application is a divisional of U.S. patent application Ser. No. 12/507,731, filed Jul. 22, 2009 which claims priority to and the benefit of Korean Patent Application No. 10-2009-0017724, filed in the Korean Intellectual Property Office on Mar. 2, 2009, the entire contents of each of which are incorporated herein by reference.

BACKGROUND

1. Technical Field

Exemplary embodiments of the present invention relate to a thin film transistor array panel. In particular, the present invention relates to a thin film transistor array panel that may be widely used in the display field, such as a liquid crystal display.

2. Related Art

A liquid crystal display (LCD) is one of the most widely used flat panel displays (FPD), and it is composed of two display panels on which field generating electrodes such as pixel electrodes and a common electrode are formed, and a liquid crystal layer interposed between the two display panels. Voltages are applied to the field generating electrodes so as to generate an electric field over the liquid crystal layer, and the alignment of liquid crystal molecules of the liquid crystal layer is determined by the electric field. Accordingly, the polarization of incident light is controlled, thereby performing image display.

The LCD also includes switching elements connected to the respective pixel electrodes and a plurality of signal lines such as gate lines and data lines for controlling the switching elements and applying voltages to the pixel electrodes.

When the LCD includes a plurality of data lines, the data lines and the switching elements are connected through bridges made of indium tin oxide (ITO). However, when applying the ITO bridge, there are problems in that an additional process is necessary and the structure is complicated.

The above information disclosed in this Background section is only for enhancement of understanding of the background of the invention and therefore it may contain information that does not form the prior art that is already known in this country to a person of ordinary skill in the art.

SUMMARY

An exemplary embodiment of the present invention provides a thin film transistor array panel to reduce complications of structures related to wiring when applying a plurality of data lines.

According to an exemplary embodiment of the present invention, a thin film transistor array panel includes a first data line, a second data line neighboring the first data line, a transistor disposed in a region between the first data line and the second data line, and a pixel electrode disposed close to the second data line among the first and second data lines, wherein an extension of the pixel electrode crosses the second data, line thereby being connected to the transistor.

A region of the second data line corresponding to the transistor is far from the first data line and becomes close thereto such that the second data line may be curved. A first gate line intersecting the first and second data lines and passing a region where the transistor is positioned may be included, and the transistor may be connected to the first data line and the first gate line.

An insulating layer covering the transistor and the first and second data lines and having a contact hole exposing the transistor may be included. Here, the pixel electrode may be disposed on the insulating layer, and the extension of the pixel electrode is connected to the transistor through the contact hole.

The transistor may include a gate electrode, a gate insulating layer covering the gate electrode, a semiconductor pattern disposed on the gate insulating layer, a source electrode disposed on the semiconductor pattern, and a drain electrode disposed on the semiconductor pattern to be separated from the source electrode. The extension may be connected to the drain electrode. The source electrode may be extended from the first data line.

The transistor may include first and second transistors. The first transistor may include a first gate electrode, a first semiconductor pattern, a first pixel electrode, and a first drain electrode. The second transistor may include a second gate electrode, a second semiconductor pattern, a second pixel electrode, and a second drain electrode. The extension of the first pixel electrode may cross the second data line, thereby being connected to the first drain electrode of the first transistor. The extension of the second pixel electrode may cross the second data line, thereby being connected to the drain electrode of the second transistor.

The thin film transistor array panel may include: a first gate line intersecting the first and second data lines; a first charge sharing transistor including a first charge sharing gate electrode, a first charge sharing semiconductor pattern, a first charge sharing source electrode, and a first charge sharing drain electrode; a first charge sharing gate line intersecting the first and second data lines; a first storage electrode line intersecting the first and second data lines; and a first lower capacitor connected between the first charge sharing drain electrode of the first charge sharing transistor and the first storage electrode line, wherein the first gate line may be connected to the first and second gate electrodes, the first charge sharing gate line may be connected to the first charge sharing gate electrode, and the first charge sharing source electrode may be connected to the second pixel electrode.

The first gate line and the first charge sharing gate line may be disposed between the first pixel electrode and the second pixel electrode. A region of the second data line corresponding to the first and second transistors may be far from the first data line and then becomes close to the first data line such that the second data line may be curved.

The thin film transistor array panel may include: a third pixel electrode neighboring the second pixel electrode; a fourth pixel electrode neighboring the third pixel electrode; a third transistor including a third gate electrode, a third semiconductor pattern, a third source electrode, and a third drain electrode; and a fourth transistor including a fourth gate electrode, a fourth semiconductor pattern, a fourth source electrode, and a fourth drain electrode, wherein the third source electrode is connected to the second data line, the third drain electrode may be connected to the third pixel electrode, the fourth source electrode may be connected to the second data line, and the fourth drain electrode may be connected to the fourth pixel electrode.

The thin film transistor array panel may include: a second gate line intersecting the first and second data lines; a second charge sharing gate line intersecting the first and second data lines; a second storage electrode line intersecting the first and second data lines; a second charge sharing transistor including a second charge sharing gate electrode, a second charge sharing semiconductor pattern, a second charge sharing source electrode, and a second charge sharing drain electrode; and a second lower capacitor connected between the second charge sharing drain electrode of the second charge sharing transistor and the second storage electrode line, wherein the second data line may be connected to the third gate electrode and the fourth gate electrode, the second charge sharing gate electrode may be connected to the second charge sharing gate line, and the second charge sharing source electrode may be connected to the fourth pixel electrode.

The second gate line and the second charge sharing gate line may be disposed between the third pixel electrode and the fourth pixel electrode. The region where the third and fourth transistors are disposed may be further inside than the second data line.

A thin film transistor array panel includes: a plurality of pixels respectively including a pixel electrode and a transistor, and arranged in columns and rows; a gate line extended in a column direction and corresponding to each pixel column; and first, second, third, and a fourth data lines corresponding to each pixel row and extended in a row direction, wherein the first and second data lines are disposed on the left side of the pixel row, the third and fourth data lines are disposed on the right side of the pixel row, and the transistors of the same pixel row are sequentially and alternately connected to the first to fourth data lines, and the connection relationship between the first to fourth data lines and the transistors of two neighboring pixel rows is inversion symmetrical.

Four gate lines may be classified into a group, and each group of gate lines may be applied with the same scanning signal. The polarity of the voltage applied to the first data line may be opposite to the polarity of the voltage applied to the second data line, and the polarity of the voltage applied to the third data line may be opposite to the polarity of the voltage applied to the fourth data line.

The transistor may be formed between the first data line and the second data line in the pixel including the transistor connected to the first data line, and the extension of the pixel electrode may cross the second data line thereby being connected to the transistor. The transistor may be formed between the fourth data line and the third data line in the pixel including the transistor connected to the fourth data line, and the extension of the pixel electrode may cross the third data line thereby being connected to the transistor.

The pixel electrode may include a first pixel electrode and a second pixel electrode, the transistor may include a first transistor and a second transistor, the extension of the first pixel electrode may cross the second data line thereby being connected to the drain electrode of the first transistor, the extension of the second pixel electrode may cross the second data line thereby being connected to the drain electrode of the second transistor in the pixel including the transistor connected to the first data line, the extension of the first pixel electrode may cross the third data line thereby being connected to the drain electrode of the first transistor, and the extension of the second pixel electrode may cross the third data line thereby being connected to the drain electrode of the second transistor in the pixel including the transistor connected to the fourth data line.

The gate line may be disposed between the first pixel electrode and the second pixel electrode. The polarity of the voltage applied to the first data line may be opposite to the polarity of the voltage applied to the second data line, and the polarity of the voltage applied to the third data line may be opposite to the polarity of the voltage applied to the fourth data line.

According to an exemplary embodiment of the present invention, it may not be necessary to use an additional connecting member between the pixel electrode and the data line such that the process may be shortened and the structure of the wiring may be simplified. Also, in one aspect, the spatial utility may be increased and thereby the degree of integration may be improved. Also, in another aspect, the pixels may be appropriately arranged in the row direction and the column direction such that a flicker of a longitudinal line and vertical cross-talk may be prevented.

DETAILED DESCRIPTION

Figure 1:
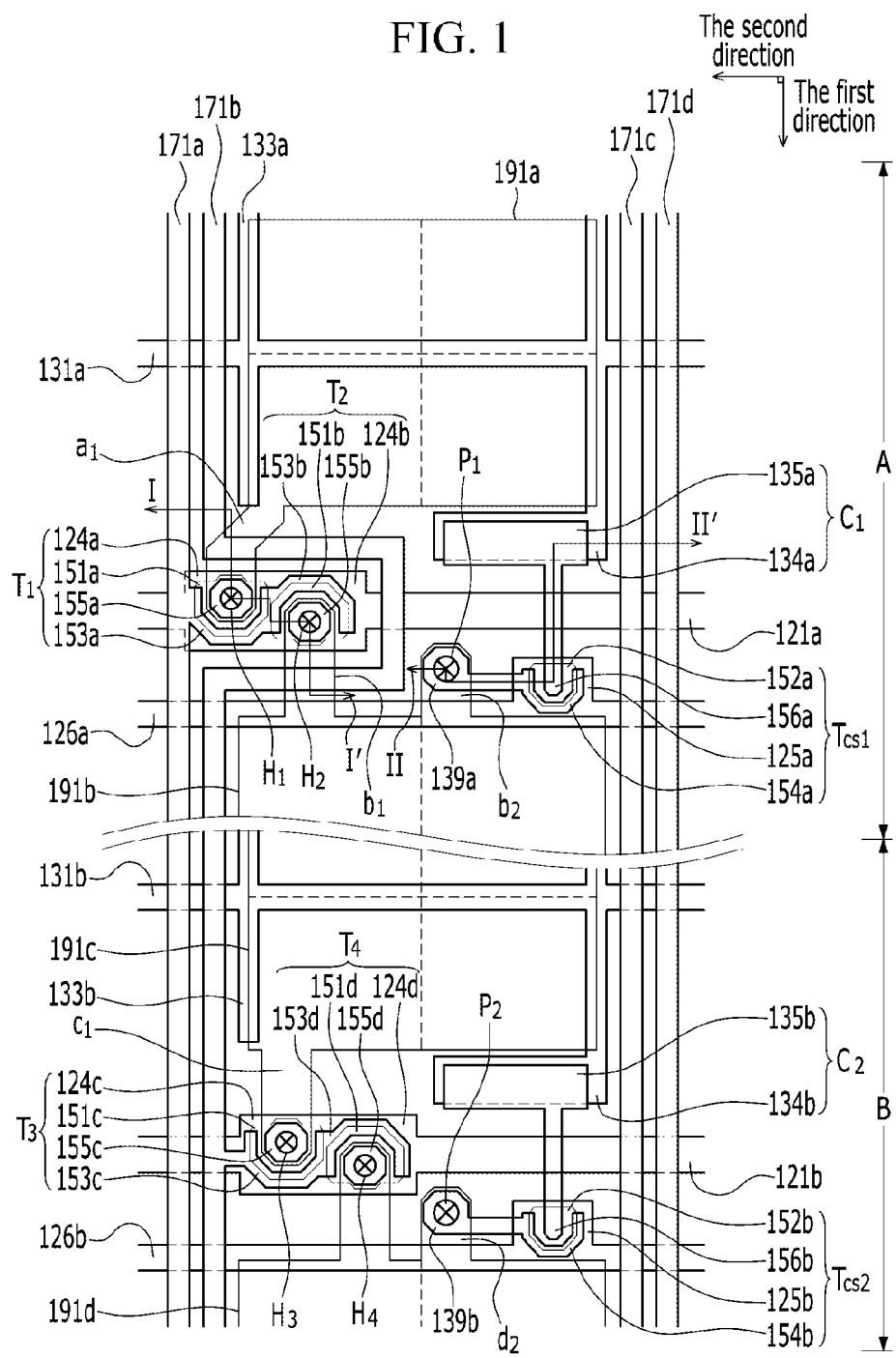
FIG. 1 is a layout view of a thin film transistor array panel, according to an exemplary embodiment of the present invention.

Exemplary embodiments of the present invention will be hereinafter described in detail with reference to the accompanying drawings. i) The structural shapes, sizes, ratios, numbers, etc., are schematically illustrated in the accompanying drawings such that they may be altered. ii) The drawings are shown from the viewpoint of observation such that the direction or location of explaining the drawings may be variously changed depending upon the position of the observer. iii) Even when reference is made to different elements, like reference numerals may be used to designate those elements. iv) When the terms "include," "have," "consist of," or the like are used, the relevant subject may include other parts unless the term "only" is used to define the contents thereof v) When explanation is made by way of a singular term, it may be interpreted in a plural manner as well as in a singular manner. vi) Even when the numerical values, shapes, size comparisons, positional relations, etc. are not explained with the adverb "about" or "substantially," they may be so interpreted as to include the common error ranges. vii) Even when the terms "after," "before," "and," "here," "subsequently," or the like are introduced, they are not meant to define temporal locations. viii) The terms "the first," "the second," . . . , etc. are used only for convenience in distinction selectively, commutatively, or repeatedly, and are not meant to be read in any defined manners. ix) It will be understood that when an element is referred to as being "on," "over," "above," "below," or "beside" another element, it can be directly on the other element or one or more intervening elements may also be present. x) When the connective "or" is used to connect two elements, it indicates the respective elements and a combination thereof, but when the quantifier "any one of" is attached to the connective, it indicate only the respective elements.

Figure 2:
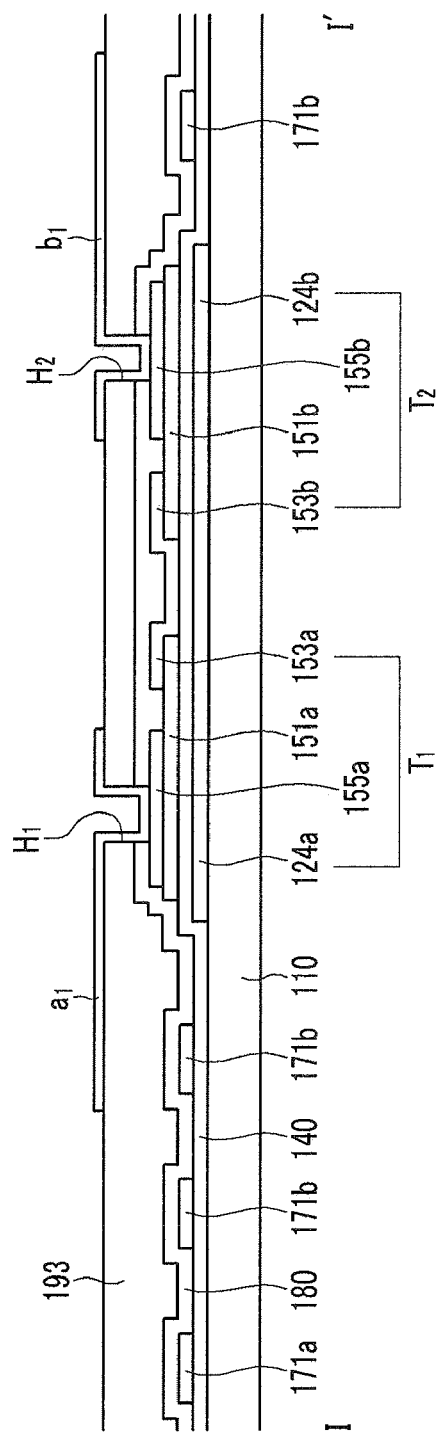
FIG. 2 is a cross-sectional view of an "A" region shown in FIG. 1 taken along the line I-I', according to an embodiment of the present invention.
Figure 3:
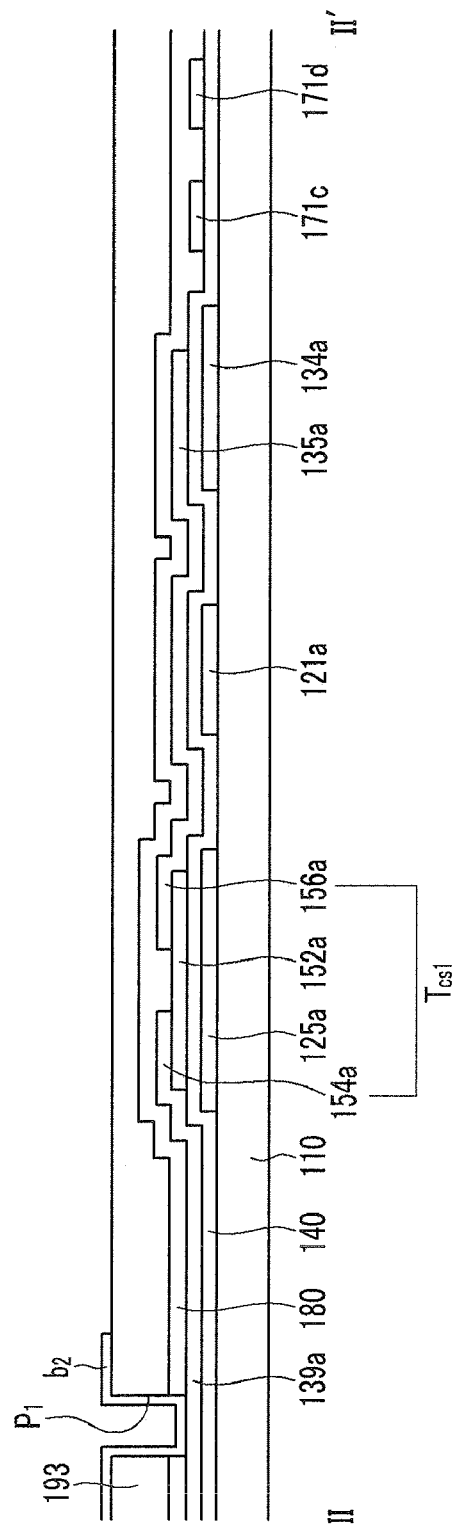
FIG. 3 is a cross-sectional view of an "A" region shown in FIG. 1 taken along the line II-II', according to an embodiment of the present invention.

FIG. 1 is a layout view of a thin film transistor array panel, according to an exemplary embodiment of the present invention. The "A" region of FIG. 1 shows an example of a pixel electrode that is connected to a data line disposed on the outside among four data lines through a transistor. The "B" region of FIG. 1 shows an example of a pixel electrode that is connected to a data line disposed on the inside among four data lines through a transistor. FIG. 2 is a cross-sectional view of an "A" region shown in FIG. 1 taken along the line I-I', in accordance with an embodiment of the present invention. FIG. 3 is a cross-sectional view of an "A" region shown in FIG. 1 taken along the line II-II', in accordance with an embodiment of the present invention.

Referring to the "A" region of FIG. 1, FIG. 2, and FIG. 3, a first storage electrode line 131a, a first storage electrode 133a, a first lower electrode 134a, a first gate line 121a, a first gate electrode 124a, a second gate electrode 124b, a first charge sharing gate electrode 125a, and a first charge sharing gate line 126a are disposed on a substrate 110.

The first storage electrode line 131a, the first gate line 121a, and the first charge sharing gate line 126a that are separated from each other are sequentially arranged according to a first direction. Also, the first storage electrode line 131a, the first gate line 121a, and the first charge sharing gate line 126a are extended according to a second direction that is substantially perpendicular to the first direction.

The first storage electrode 133a may be formed as a pair thereof and is extended from the first storage electrode line 131a according to the first direction. The first lower electrode 134a is extended from the first storage electrode 133a according to the second direction.

The first gate electrode 124a and the second gate electrode 124b are integrally formed along with the first gate line 121a. Portions that are expanded into a wide width from the first gate line 121a may be used as the first gate electrode 124a and the second gate electrode 124b.

The first charge sharing gate electrode 125a is integrally formed along with the first charge sharing gate line 126a. Portions that are expanded into a wide width from the first charge sharing gate line 126a may be used as the first charge sharing gate electrode 125a.

The first storage electrode line 131a, the first storage electrode 133a, the first lower electrode 134a, the first gate line 121a, the first gate electrode 124a, the second gate electrode 124b, the first charge sharing gate electrode 125a and the first charge sharing gate line 126a are coated by a gate insulating layer 140.

A first semiconductor pattern 151a, a second semiconductor pattern 151b, and a first charge sharing semiconductor pattern 152a are respectively disposed on the first gate electrode 124a, the second gate electrode 124b, and the first charge sharing gate electrode 125a on the gate insulating layer 140.

A first data line 171a and a second data line 171b on the gate insulating layer 140 are disposed on one side of the substrate close to the first semiconductor pattern 151a and the second semiconductor pattern 151b. Here, the first data line 171a is disposed to be positioned further outside than the second data line 171b.

In one aspect, the first data line 171a is extended in the first direction and disposed further outside than the first and second semiconductor patterns 151a and 151b. The second data line 171b is extended in the first direction and has a shape of which a portion thereof corresponding to the first and second semiconductor patterns 151a and 151b is recessed inside the substrate so as to not be overlapped with the first and second semiconductor patterns 151a and 151b. That is, for example, the second data line 171b is curved with a shape such that it becomes gradually apart from the first data line 171a and then closer thereto. The first and second semiconductor patterns 151a and 151b are disposed between the first data line 171a and the second data line 171b.

Third and fourth data lines 171c and 171d on the gate insulating layer 140 are disposed opposite to the first and second data lines 171a and 171b on the other side of the thin film transistor array panel. The fourth data line 171d is disposed further outside than the third data line 171c. The third and fourth data lines 171c and 171d are extended in the first direction.

A first source electrode 153a is extended from the first data line 171a and partially overlaps the first semiconductor pattern 151a. A second source electrode 153b is extended from the first source electrode 153a and partially overlaps the second semiconductor pattern 151b. A first charge sharing source electrode 154a partially overlaps the first charge sharing semiconductor pattern 152a.

A first drain electrode 155a is formed on the first semiconductor pattern 151a to be separated from the first source electrode 153a. A second drain electrode 155b is formed on the second semiconductor pattern 151b to be separated from the second source electrode 153b. A first charge sharing drain electrode 156a is formed on the first charge sharing semiconductor pattern 152a to be separated from the first charge sharing source electrode 154a.

A first contact region 139a has a shape extended from the first charge sharing source electrode 154a. Also, a first upper electrode 135a is extended from the first charge sharing drain electrode 156a and overlaps the first lower electrode 134a.

A passivation layer 180 coats the above-described structures. Also, the passivation layer 180 is coated by an insulating layer 193. According to an exemplary embodiment of the present invention, a color filter (not shown) may be positioned between the passivation layer 180 and the insulating layer 193.

The insulating layer 193 and the passivation layer 180 have a first contact hole H1, a second contact hole H2, and a first opening P1 respectively exposing the first drain electrode 155a, the second drain electrode 155b, and the first contact region 139a.

First and second pixel electrodes 191a and 191b are formed on the insulating layer 193. The first and second pixel electrodes 191a and 191b are disposed between the second data lines 171b and the third data lines 171c, and face each other via the first and second semiconductor patterns 151a and 151b. Also, the first gate line 121a and the first charge sharing gate line 126a are disposed between the first and second pixel electrodes 191a and 191b.

The first pixel electrode 191a includes an extension a1 into one body. The extension a1 crosses the second data line 171b and is filled in the first contact hole H1. Accordingly, the first pixel electrode 191a is electrically connected to the first drain electrode 155a through the extension a1.

The second pixel electrode 191b includes an extension b1 and a protrusion b2 into one body. The extension b1 crosses the second data line 171b and is filled in the second contact hole H2. Accordingly, the second pixel electrode 191b is electrically connected to the second drain electrode 155b through the extension b1. The protrusion b2 is extended and filled in the first opening P1. Accordingly, the second pixel electrode 191b is electrically connected to the first contact region 139a through the protrusion b2.

The first gate electrode 124a, the first semiconductor pattern 151a, the first source electrode 153a, and the first drain electrode 155a form a first transistor T1. The second gate electrode 124b, the second semiconductor pattern 151b, the second source electrode 153b, and the second drain electrode 155b form the second transistor T2. The first charge sharing gate electrode 125a, the first charge sharing semiconductor pattern 152a, the first charge sharing source electrode 154a, and the first charge sharing drain electrode 156a form a first charge sharing transistor Tcs1. The first lower electrode 134a, the gate insulating layer 140, and the first upper electrode 135a form a first lower capacitor C1.

A charge sharing effect may be realized between the first pixel electrode 191a and the second pixel electrode 191b by using the first charge sharing transistor Tcs1. In one aspect, when the first charge sharing transistor Tcs1 is turned on after the first and second transistors T1 and T2 are turned on, a portion of the charges charged to the second pixel electrode 191b among the charges charged to the first pixel electrode 191a and the second pixel electrode 191b with the same voltages are moved to the first lower capacitor C1 such that the voltage of the second pixel electrode 191b is lower than that of the first pixel electrode 191a. Accordingly, a voltage difference is formed between the first pixel electrode 191a and the second pixel electrode 191b such that lateral visibility may be improved.

As described above, the extension a1 of the first pixel electrode 191a crosses the second data line 171b and is directly connected to the first drain electrode 155a of the first transistor T1 that is exposed through the first contact hole H1. Also, the extension b1 of the second pixel electrode 191b crosses the second data line 171b and is directly connected to the second drain electrode 155b of the second transistor T2 that is exposed through the second contact hole H2. Accordingly, additional connecting members are not necessary between the pixel electrodes and the data lines such that the manufacturing process may be simplified and the wiring structure may be simple. Also, the first and second transistors T1 and T2 are disposed between the first and second data lines 171a and 171b. Accordingly, the spatial utility is increased and thereby the aperture ratio may be improved.

Referring to a "B" region of FIG. 1, a second charge sharing transistor Tcs2 including a second charge sharing gate electrode 125b, a second charge sharing semiconductor pattern 152b, a second charge sharing source electrode 154b, and a second charge sharing drain electrode 156b, a second lower capacitor C2 including a second lower electrode 134b, the gate insulating layer 140, and a second upper electrode 135b, a second gate line 121b, a second charge sharing gate line 126b, a second storage electrode line 131b, a second storage electrode 133b, and a second contact region 139b are respectively substantially the same as the first charge sharing transistor Tcs1 including the first charge sharing gate electrode 125a, the first charge sharing semiconductor pattern 152a, the first charge sharing source electrode 154a, and the first charge sharing drain electrode 156a, the first lower capacitor C1 including the first lower electrode 134a, the gate insulating layer 140, and the first upper electrode 135a, and the first gate line 121a, the first charge sharing gate line 126a, the first storage electrode line 131a, the first storage electrode 133a, and the first contact region 139a of the "A" region such that a repeated description is omitted.

In the "B" region, the second data line 171b is substantially extended according to the first direction with a straight line shape, differently from the "A" region where it is curved inside. In the "B" region, a third transistor T3 including a third gate electrode 124c, a third semiconductor pattern 151c, a third source electrode 153c, and a third drain electrode 155c, and a fourth transistor T4 including a fourth gate electrode 124d, a fourth semiconductor pattern 151d, a fourth source electrode 153d, and a fourth drain electrode 155d are substantially the same as the first transistor T1 and the second transistor T2 of the "A" region except for the positions thereof. Accordingly, repeated description is omitted.

The first and second transistors T1 and T2 of the "A" region are formed between the first and second data lines 171a and 171b, however the third and fourth transistors T3 and T4 of the "B" region are disposed further inside than the second data line 171b. The third and fourth source electrodes 153c and 153d of the "B" region are substantially the same as the first and second source electrodes 153a and 153b of the "A" region except for the data line connected thereto. Accordingly, the repeated description is omitted.

In the "B" region, a third pixel electrode 191c neighboring the second pixel electrode 191b of the "A" region and a fourth pixel electrode 191d adjacent to the third pixel electrode 191c are disposed. The third and fourth pixel electrodes 191c and 191d of the "B" region are substantially the same as the first and second pixel electrodes 191a and 191d of the "A" region except for the extensions c1 and d1. Accordingly, the repeated description is omitted.

In the "A" region, the extension a1 of the first pixel electrode 191a crosses the second data line 171b and is connected to the first drain electrode 155a through the first contact hole H1 of the insulating layer 193, however in the "B" region, the extension c1 of the third pixel electrode 191c does not cross the second data line 171b and is connected to the third drain electrode 155c through the third contact hole H3 of the insulating layer 193.

In the "A" region, the extension b1 of the second pixel electrode 191b crosses the second data line 171b and is connected to the second drain electrode 155b through the second contact hole H2 of the insulating layer 193, however in the "B" region, the extension d1 of the fourth pixel electrode 191d does not cross the second data line 171b and is connected to the fourth drain electrode 155d through the fourth contact hole H4 of the insulating layer 193.

Accordingly, in the "B" region, the third and fourth pixel electrodes 191c and 191d are respectively connected to the second data line 171b through the third and fourth transistors T3 and T4 including the third and fourth source electrodes 153c and 153d.

Also, the protrusion d2 of the fourth pixel electrode 191d shown in the "B" region is extended and filled in the second opening P2, substantially like the protrusion b2 of the second pixel electrode 191b shown in the "A" region. Accordingly, the fourth pixel electrode 191d is electrically connected to the second contact region 139b by the protrusion d2.

In the present exemplary embodiment, a charge sharing method in which the thin film transistor array panel is driven through four data lines by applying the charge sharing transistor and the capacitor is described. However, the thin film transistor array panel may be applied to various driving method such as a charge pumping method that is driven by four data lines.

Figure 4:
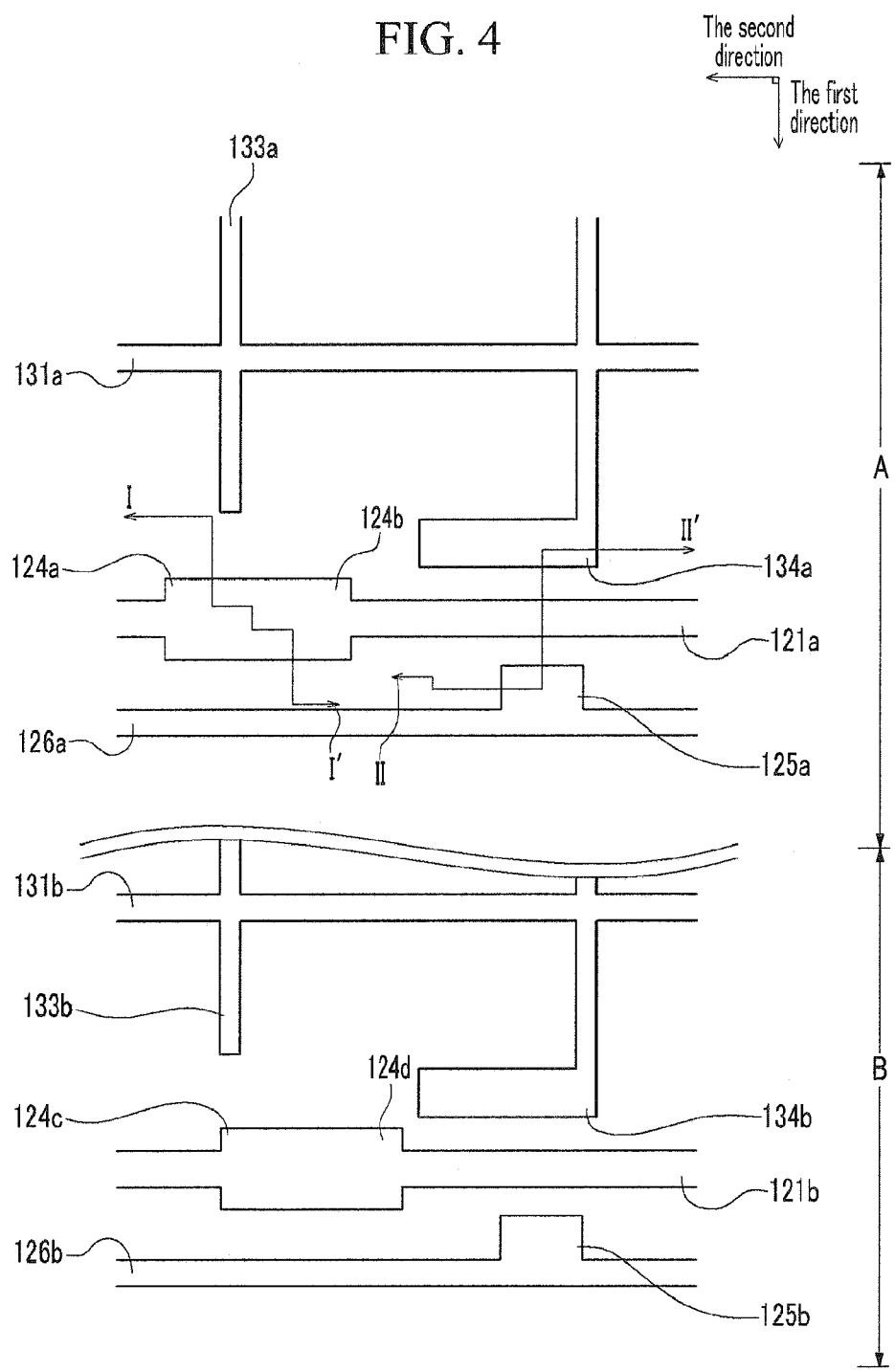
FIGS. 4, 7, and 10 are layout views showing a thin film transistor array panel in a manufacturing method of the thin film transistor array panel shown in FIG. 1, according to embodiments of the present invention.
Figure 5:
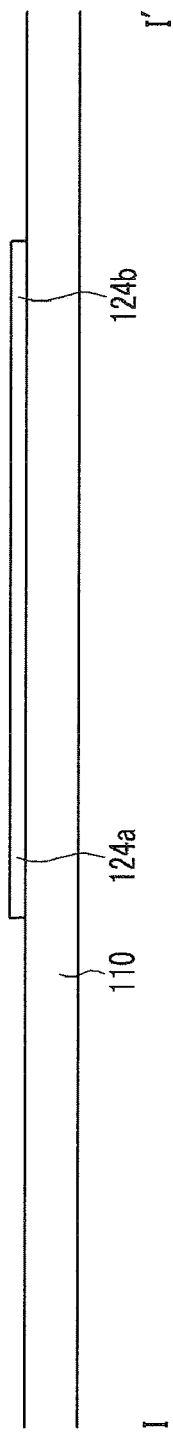
FIGS. 5, 8, and 11 are cross-sectional views of the "A" region shown in FIGS. 4, 7, and 10 taken along the line I-I', according to embodiments of the present invention.
Figure 6:
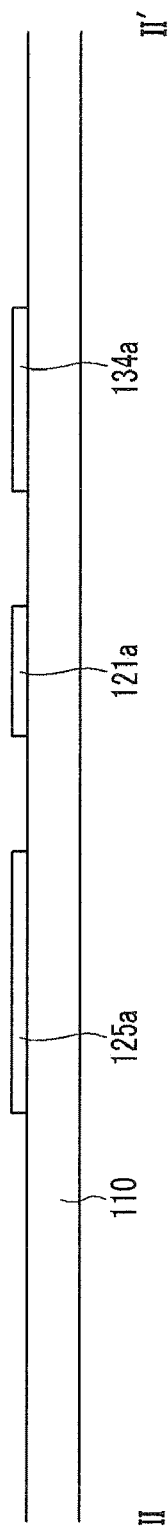
FIGS. 6, 9, and 12 are cross-sectional views of the "A" region shown in FIGS. 4, 7, and 10 taken along the line II-II', according to embodiments of the present invention.
Figure 7:
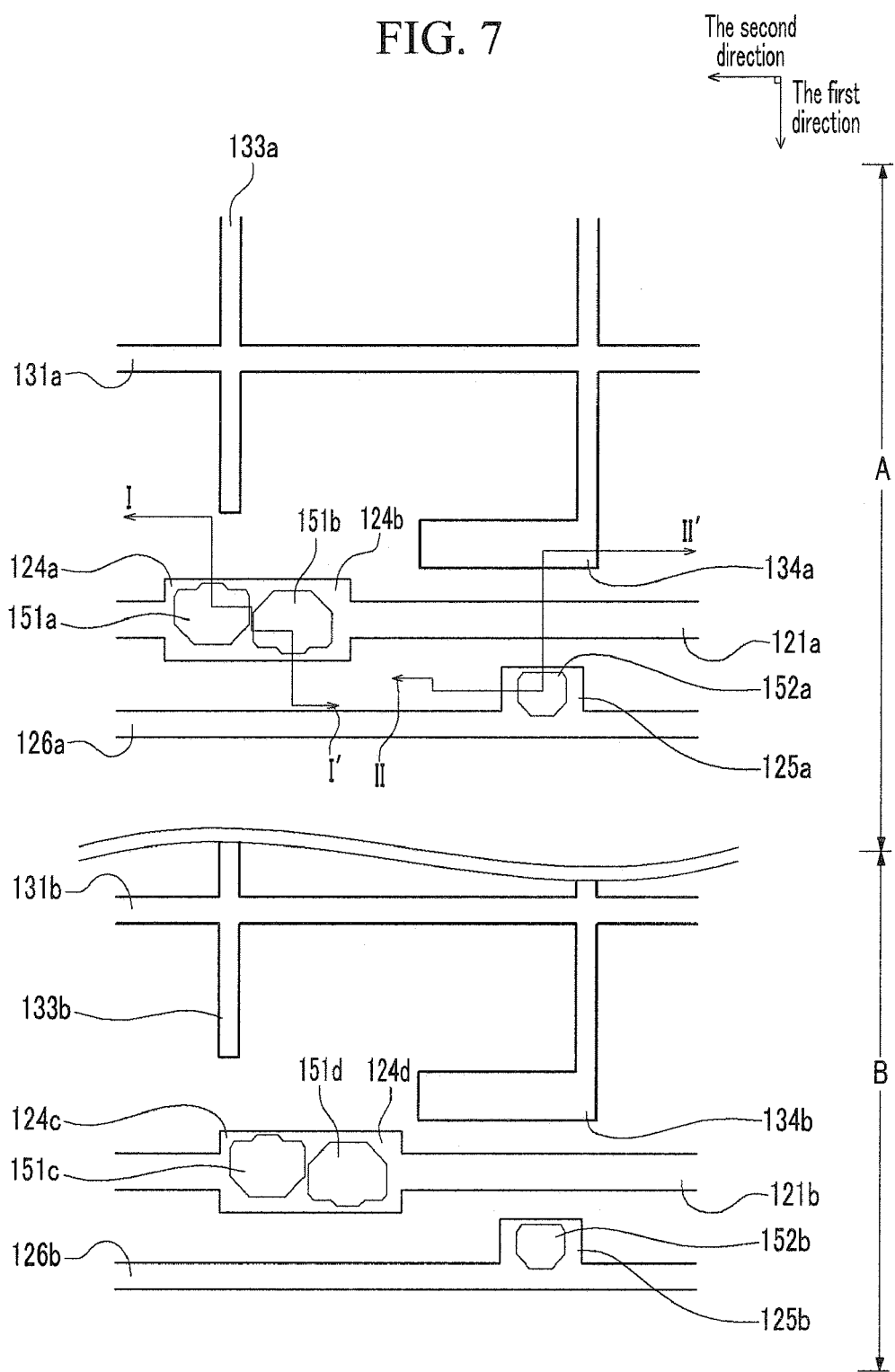
Figure 8:
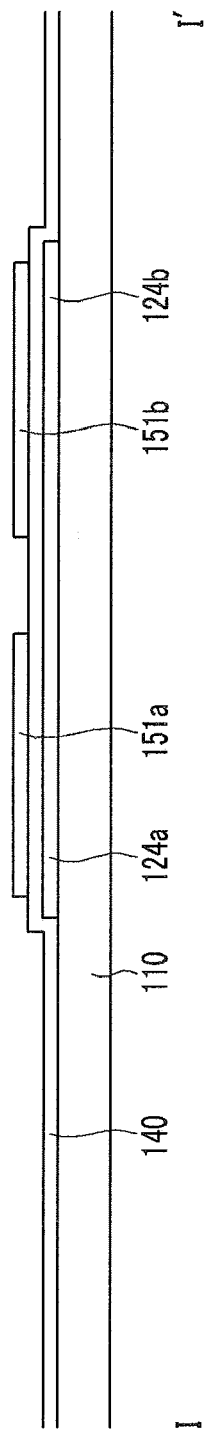
Figure 9:
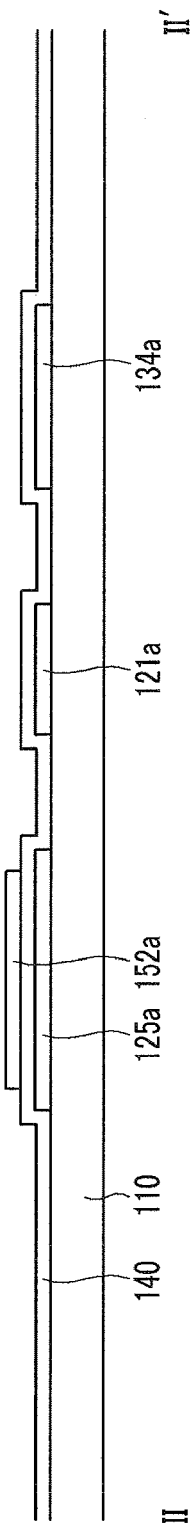
Figure 10:
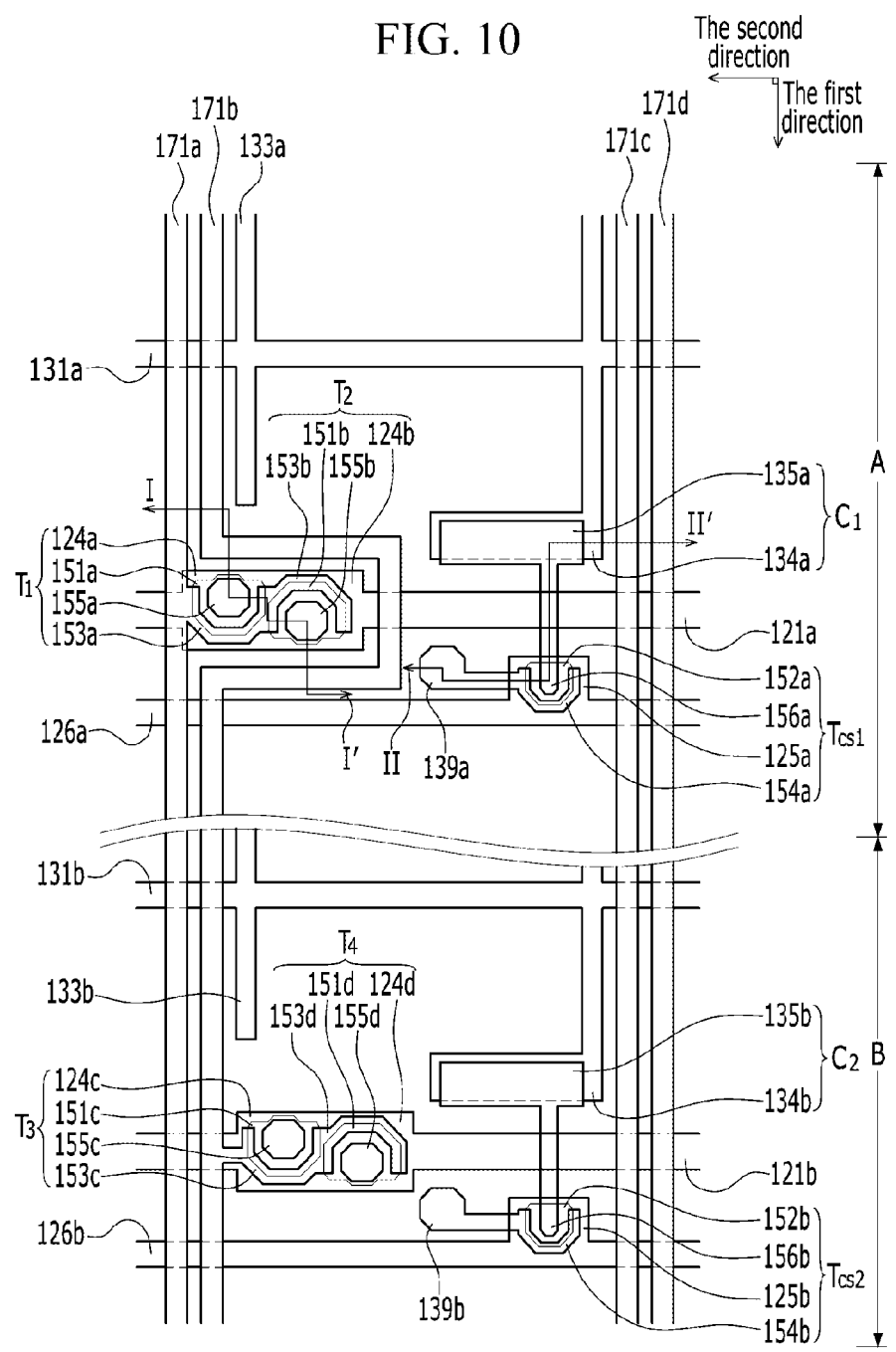
Figure 11:
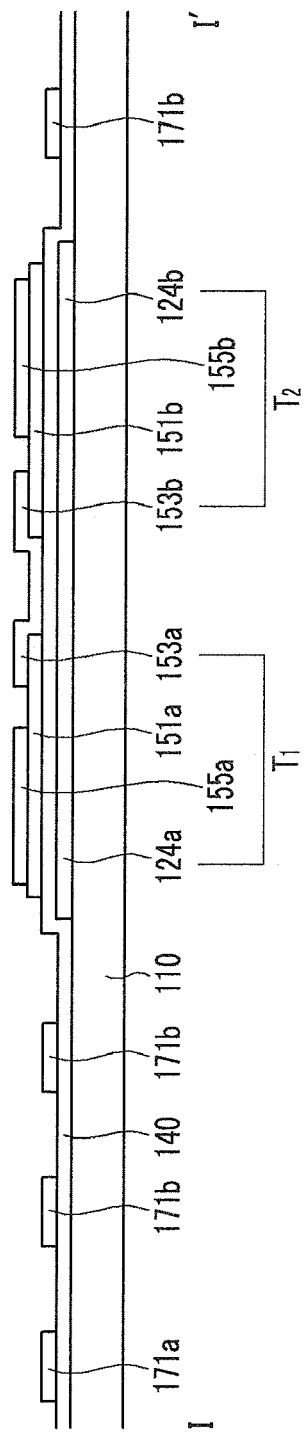
Figure 12:
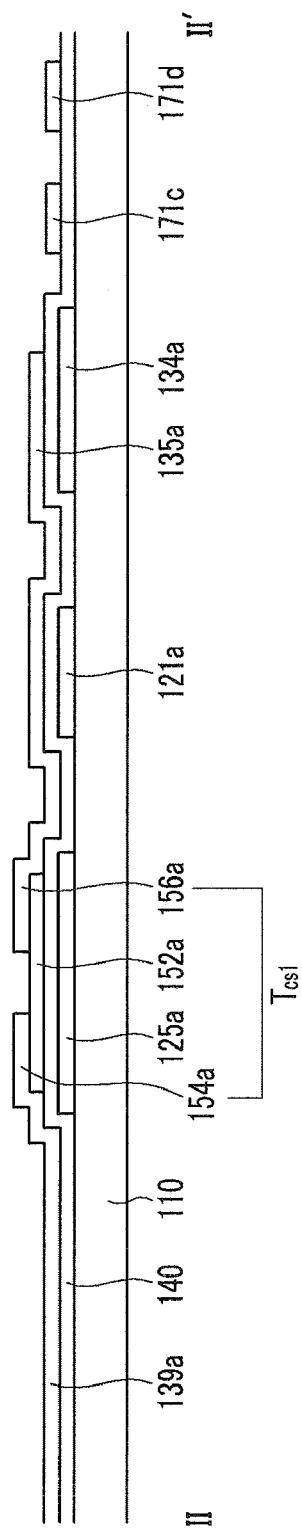

FIGS. 4, 7, and 10 are layout views showing a thin film transistor array panel in a manufacturing method of the thin film transistor array panel shown in FIG. 1, in accordance with embodiments of the present invention. The "A" region of FIGS. 4, 7, and 10 shows an example where the data lines disposed outside among four data lines are connected to pixel electrodes through transistors. The "B" region of FIGS. 4, 7, and 10 shows an example where the data lines disposed inside among four data lines are connected to pixel electrodes through transistors. FIGS. 5, 8, and 11 are cross-sectional views of the "A" region shown in FIGS. 4, 7, and 10 taken along the line I-I', in accordance with embodiments of the present invention. FIGS. 6, 9, and 12 are cross-sectional views of the "A" region shown in FIGS. 4, 7, and 10 taken along the line II-II', in accordance with embodiments of the present invention.

Referring to the "A" region of FIG. 4, FIG. 5, and FIG. 6, a conductive layer (not shown) is formed on a substrate 110. Next, the conductive layer is etched to form the first storage electrode line 131*a*, the first storage electrode 133*a*, the first lower electrode 134*a*, the first gate line 121*a*, the first gate electrode 124*a*, the second gate electrode 124*b*, the first charge sharing gate electrode 125*a*, and the first charge sharing gate line 126*a*.

The first storage electrode line 131*a*, the first gate line 121*a*, and the first charge sharing gate line 126*a* are sequentially arranged according to the first direction to be separated from each other. Also, the first storage electrode line 131*a*, the first gate line 121*a*, and the first charge sharing gate line 126*a* are extended according to the second direction that is substantially perpendicular to the first direction.

The first storage electrode 133*a* may be a pair thereof and is extended according to the first direction from the first storage electrode line 131*a*. The first lower electrode 134*a* is extended from the first storage electrode 133*a* according to the second direction.

The first gate electrode 124*a* and the second gate electrode 124*b* are integrally formed along with the first gate line 121*a*. A portion where the width thereof is expanded on the first gate line 121*a* may be used as the first gate electrode 124*a* and the second gate electrode 124*b*.

The first charge sharing gate electrode 125*a* is integrally formed along with the first charge sharing gate line 126*a*. A portion that is extended into the wide width of the first charge sharing gate line 126*a* may be used as the first charge sharing gate electrode 125*a*.

The "B" region of FIG. 4 is substantially the same as the "A" region except for the third and fourth gate electrodes 124*c* and 124*d*. Accordingly, the repeated description is omitted.

Referring to the "B" region of FIG. 4, the third and fourth gate electrodes 124*c* and 124*d* of the "B" region are substantially the same as the first and second gate electrodes 124*a* and 124*b* of the "A" region except for the fact that they are disposed further inside than the first and second gate electrode 124*a* and 124*b* of the "A" region.

Referring to the "A" region of FIG. 7, FIG. 8, and FIG. 9, a gate insulating layer 140 covering the first storage electrode line 131*a*, the first storage electrode 133*a*, the first lower electrode 134*a*, the first gate line 121*a*, the first gate electrode 124*a*, the second gate electrode 124*b*, the first charge sharing gate electrode 125*a*, and the first charge sharing gate line 126*a* is formed on the substrate 110.

Next, a semiconductor layer (not shown) is formed on the gate insulating layer 140. Next, the semiconductor layer is etched to form the first semiconductor pattern 151*a*, the second semiconductor pattern 151*b*, and the first charge sharing semiconductor pattern 152*a*.

Here, in one aspect, the first semiconductor pattern 151*a*, the second semiconductor pattern 151*b*, and the first charge sharing semiconductor pattern 152*a* may be respectively formed on the first gate electrode 124*a*, the second gate electrode 124*b*, and the first charge sharing gate electrode 125*a*.

The "B" region of FIG. 7 is substantially the same as the "A" region except for the position of the third and fourth semiconductor patterns 151*c* and 151*d*. Accordingly, the overlapping description is omitted.

Referring to the "B" region of FIG. 7, the third and fourth semiconductor patterns 151*c* and 151*d* of the "B" region are substantially the same as the first and second semiconductor patterns 151*a* and 151*b* of the "A" region except for the fact that they are disposed further inside than the first and second semiconductor patterns 151*a* and 151*b* of the "A" region. In one aspect, the third and fourth gate electrodes 124*c* and 124*d* in the "B" region are disposed further inside than the first and second gate electrodes 124*a* and 124*c* of the "A" region, and the third and fourth semiconductor patterns 151*c* and 151*d* are respectively formed on the third and fourth gate electrodes 124*c* and 124*d*.

Referring to the "A" region of FIG. 10, FIG. 11, and FIG. 12, a conductive layer (not shown) covering the first semiconductor pattern 151*a*, the second semiconductor pattern 151*b*, and the first charge sharing semiconductor pattern 152*a* is formed on the gate insulating layer 140.

Next, the conductive layer is etched to form the first data line 171*a*, the second data line 171*b*, the third data line 171*c*, the fourth data line 171*d*, the first source electrode 153*a*, the second source electrode 153*b*, the first charge sharing source electrode 154*a*, the first drain electrode 155*a*, the second drain electrode 155*b*, the first charge sharing drain electrode 156*a*, the first contact region 139*a*, and the first upper electrode 135*a*.

The first data line 171*a* and the second data line 171*b* are formed on one side of the thin film transistor array panel close to the first semiconductor pattern 151*a* and the second semiconductor pattern 151*b*, and the first data line 171*a* is disposed further outside than the second data line 171*b*.

In one aspect, the first data line 171*a* is extended into the first direction and is disposed further outside than the first and second semiconductor patterns 151*a* and 151*b*. The second data line 171*b* is extended in the first direction and has a shape in which a portion corresponding to the first and second semiconductor patterns 151*a* and 151*b* is recessed inside the thin film transistor array panel so as to not be overlapped with the first and second semiconductor patterns 151*a* and 151*b*. That is, the second data line 171*b* is curved with a shape that it is close to the first data line 171*a* and then becomes far from the first data line 171*a*, and thereby the portion corresponding to the first and second semiconductor patterns 151*a* and 151*b* are formed. Accordingly, the first and second semiconductor patterns 151*a* and 151*b* are disposed between the first data line 171*a* and the second data line 171*b*.

The third data line 171*c* and the fourth data line 171*d* are disposed on the other side of the thin film transistor array panel, and the fourth data line 171*d* is disposed further outside than the third data line 171*c*. The third and fourth data lines 171*c* and 171*d* are extended in the first direction.

The first source electrode 153*a* is extended from the first data line 171*a* and partially overlaps the first semiconductor pattern 151*a*. The second source electrode 153*b* is extended from the first source electrode 153*a* and partially overlaps the second semiconductor pattern 151*b*. The first charge sharing source electrode 154*a* partially overlaps the first charge sharing semiconductor pattern 152*a*.

The first drain electrode 155*a* is formed on the first semiconductor pattern 151*a* to be separated from the first source electrode 153*a*. The second drain electrode 155*b* is formed on the second semiconductor pattern 151*b* to be separated from the second source electrode 153*b*. The first charge sharing drain electrode 156*a* is formed on the first charge sharing semiconductor pattern 152*a* to be separated from the first charge sharing source electrode 154*a*.

The first contact region 139*a* is extended from the first charge sharing source electrode 154*a*. Also, the first upper electrode 135a is extended from the first charge sharing drain electrode 156a, and has a portion overlapping the first lower electrode 134a.

The "B" region of FIG. 10 is substantially the same as the "A" region except for the shape of the second data line 171b, the position of the third and fourth semiconductor patterns 151c and 151d, and the third and fourth source electrodes 153c and 153d. Accordingly, the overlapping description is omitted. Referring to the "B" region of FIG. 10, the second data line 171b is substantially extended according to the first direction with the stripe line, differently from the curved shape of the "A" region.

The third and fourth semiconductor patterns 151c and 151d of the "B" region are substantially the same as the first and second semiconductor patterns 151a and 151b that are disposed between the first data line 171a and the second data line 171b of the "A" region except for the fact that they are disposed further inside than the second data line 171b. This is because the third and fourth gate electrode 124c and 124d on the third and fourth semiconductor patterns 151c and 151d in the "B" region are disposed further inside than the second data line 171b.

The third and fourth source electrodes 153c and 153d of the "B" region are substantially the same as the first and second source electrodes 153a and 153b that are extended from the first data line 171 a in the "A" region except for the fact that they are extended from the second data line 171b.

Again referring to the "A" region of FIG. 1, FIG. 2, and FIG. 3, a passivation layer 180 is deposited after forming the above-described structures. Next, an insulating layer 193 is formed on the passivation layer 180. According to an exemplary embodiment of the present invention, the insulating layer 193 may be formed on the passivation layer 180 after forming a color filter (not shown).

The insulating layer 193 and the passivation layer 180 are etched to form the first contact hole H1, the second contact hole H2, and the first opening P1 exposing the first drain electrode 155a, the second drain electrode 155b, and the first contact region 139a, respectively.

Next, a conductive layer (not shown) filling the first and second contact holes H1 and H2 and the first opening P1 is formed on the insulating layer 193. Next, the conductive layer is etched to form the first and second pixel electrodes 191a and 191b.

Here, in one aspect, the first and second pixel electrodes 191a and 191b are formed between the second data lines 171b and the third data lines 171c and face each other via the first and second semiconductor patterns 151a and 151b.

The first pixel electrode 191a includes the extension a1 in one body. The extension a1 crosses the second data line 171b and fills the first contact hole H1. Accordingly, the first pixel electrode 191a is electrically connected to the first drain electrode 155a by the extension a1.

The second pixel electrode 191b includes the extension b1 and the protrusion b2 in one body. The extension b1 crosses the second data line 171b and is filled in the second contact hole H2. Accordingly, the second pixel electrode 191b is electrically connected to the second drain electrode 155b through the extension b1. The protrusion b2 is extended and filled in the first opening P1. Accordingly, the second pixel electrode 191b is electrically connected to the first contact region 139a by the protrusion b2.

The "B" region of FIG. 1 is substantially the same as the "A" region except for the extension a1 of the first pixel electrode 191a and the extension b1 of the second pixel electrode 191b. Accordingly, the overlapping description is omitted.

In the "A" region, the extension a1 of the first pixel electrode 191a crosses the second data line 17 1b and is connected to the first drain electrode 155a through the first contact hole H1 of the insulating layer 193, however in the "B" region, the extension c1 of the third pixel electrode 191c does not cross the second data line 171b, and is connected to the third drain electrode 155c through the third contact hole H3 of the insulating layer 193.

In the "A" region, the extension b1 of the second pixel electrode 191b crosses the second data line 171b and is connected to the second drain electrode 155b through the second contact hole H2 of the insulating layer 193, however, in the "B" region, the extension d1 of the fourth pixel electrode 191d does not cross the second data line 171b and is connected to the fourth drain electrode 155d through the fourth contact hole H4 of the insulating layer 193.

Also, in one aspect, the protrusion d2 of the fourth pixel electrode 191d shown in the "B" region is extended and filled in the second opening P2, substantially like the protrusion b2 of the second pixel electrode 191b shown in the "A" region. Accordingly, the fourth pixel electrode 191d is electrically connected to the second contact region 139b by the protrusion d2.

Figure 13:
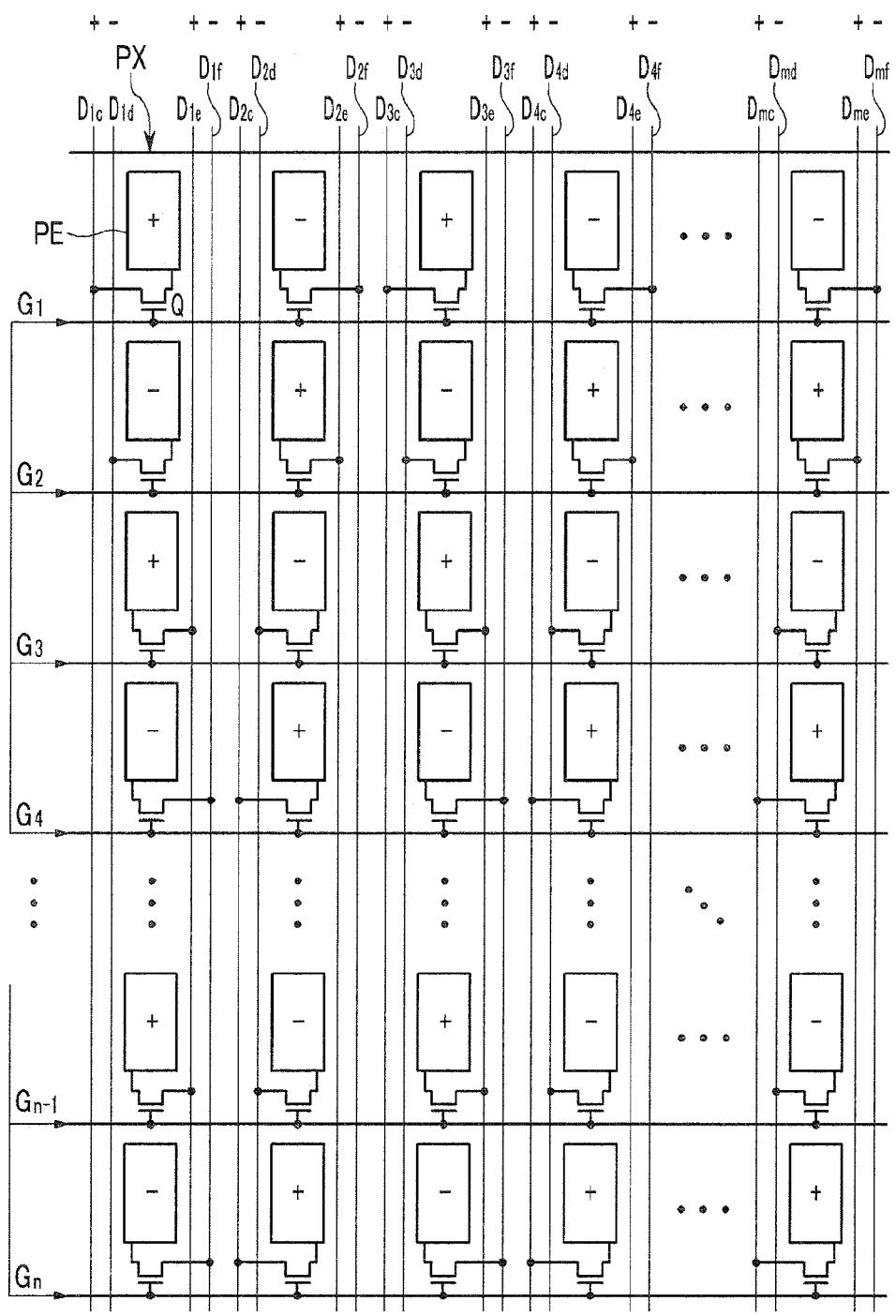
FIG. 13 is a layout view of a thin film transistor array panel, according to another exemplary embodiment of the present invention.

FIG. 13 is a layout view showing an arrangement of a thin film transistor array panel shown in FIG. 1, according to an exemplary embodiment of the present invention.

Referring to FIG. 13, a thin film transistor array panel includes a plurality of pixels PX arranged in rows and columns. Each pixel PX includes a pixel electrode PE and a switching element Q including at least one transistor connected to the pixel electrode PE.

A plurality of gate lines G1, G2, G3, and G4 are extended in a transverse direction between the pixels PX of the rows. A plurality of pairs of data lines D1c, D1d, D1e, D1f, D2c, D2d, D2e, D2f, D3c, D3d, D3e, D3f, D4c, D4d, D4e, D4f, . . . , Dmc, Dmd, Dme, and Dmf are arranged in a longitudinal direction on the right and left sides with respect to the pixels PX. The switching elements Q are connected to the gate lines G1-Gn and the data lines D1-Dmf.

With respect to the pixel PX of the first row and the first column, one pixel PX is connected to one gate line G1 and four data lines D1c, D1d, D1e, and D1f. Hereafter, four data lines D1c, D1d, D1e, and D1f are sequentially referred to as the first data line D1c, the second data line D1d, the third data line D1e, and the fourth data line D1f from the left side.

The first and second data lines D1c and D1d are disposed on the left side with respect to the pixel PX, and the first data line D1c is disposed further outside than the second data line D1d. The third and fourth data lines D1e and D1f are disposed on the right with respect to the pixel PX, and the fourth data line D1f is disposed further outside than the third data line D1e.

The switching element Q of the pixel PX disposed on the first row and the first column is connected to the first data line D1c. The switching element Q of the pixel PX disposed on the first row and the second column is connected to the second data line D1d. The switching element Q of the pixel PX disposed on the first row and the third column is connected to the third data line D1e. The switching element Q of the pixel PX disposed on the first row and the fourth column is connected to the fourth data line D1f. That is, in one aspect, the switching element Q of the pixels PX is sequentially connected to the first data line D1c, the second data line D1d, the third data line D1e, and the fourth data line D1f according to the first row.

The switching elements Q of the pixels PX disposed in the first column and the first row are connected to the first data line D1c. The switching elements Q of the pixels PX disposed in the first column and the second row are connected to the fourth data line D2f. The switching element Q of the pixel PX disposed on the first column and the third row is connected to the first data line D3c. The switching element Q of the pixel PX disposed on the first column and the fourth row is connected to the fourth data line D4f. Accordingly, the switching elements Q of the pixel PX according to the row direction may be connected to the data lines that are symmetrical with reference to the pixel electrode PE. That is, in one aspect, the connection of the first to fourth data lines of the neighboring pixels PX of the rows and the transistors may be an inversion symmetrical to each other.

Here, in one aspect, the thin film transistor array panel shown in the "A" region of FIG. 1 may be applied to the pixel PX connected to the first data lines D1c, D2c, ..., Dmc or the fourth data lines D1f, D2f, ..., Dmf through the switching element Q including the transistor.

In one aspect, the pixels PX in which the pixel electrode PE is connected to the first data lines D1c, D2c, ..., Dmc include the transistors that are formed at the space between the first data lines D1c, D2c, ..., Dmc and the second data lines D1d, D2d, ..., Dmd, and the extensions of the pixel electrodes PE cross the second data lines D1d, D2d, ..., Dmd and may be connected to the transistor.

The pixels PX in which the pixel electrodes PE are connected to the fourth data lines D1f, D2f, ..., Dmf include the transistors that are formed in the space between the third data lines D1e, D2e, ..., Dme and the fourth data lines D1f, D2f, ..., Dmf, and the extensions of the pixel electrodes PE cross the third data lines D1e, D2e, ..., Dme and may be connected to the transistors.

On the other hand, the pixels PX connected to the second data lines D1d, D2d, ..., Dmd or the third data lines D1e, D2e, ..., Dme through the switching element Q including the transistor apply the thin film transistor array panel shown in the "B" region of FIG. 1.

Four neighboring gate lines G1, G2, G3, and G4 are connected to each other thereby forming a group, and are applied with the same scanning signal. The polarity of the voltage applied to the first data lines D1c, D2c, ..., Dmc and the third data lines D1e, D2e, ..., Dme and the polarity of the voltage applied to the second data lines D1d, D2d, ..., Dmd and the fourth data lines D1f, D2f, ..., Dmf are opposite to each other.

For example, when a voltage of a positive polarity is applied to the first data lines D1c, D2c, ..., Dmc and the third data lines D1e, D2e, ..., Dme, a voltage of a negative polarity is applied to the second data lines D1d, D2d, ..., Dmd and the fourth data lines D1f, D2f, ..., Dmf.

Accordingly, the polarities of the pixels PX that are neighboring in the row direction are opposite to each other, and the polarities of the pixels PX that are neighboring in the column direction are also opposite to each other. That is, a predetermined pixel PX has a different polarity for the pixels PX that are neighboring in the row direction and the column direction. Accordingly, flicker of a longitudinal line and vertical crosstalk may be prevented.

While embodiments of the present invention have been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
a plurality of pixels arranged in columns and rows, each pixel including a pixel electrode and a transistor;
a gate line extended in a column direction and corresponding to each pixel column; and
first, second, third, and fourth data lines corresponding to each pixel row and extended in a row direction;
wherein the first and second data lines are disposed on the left side of the corresponding pixel row, the third and fourth data lines are disposed on the right side of the corresponding pixel row, and the transistors of the same pixel row are sequentially and alternately connected to the first to fourth data lines, and
wherein the connection relationship between the first to fourth data lines and the transistors of two neighboring pixel rows is inversion symmetrical.

2. The thin film transistor array panel of claim 1, wherein four gate lines are classified into a group, and each group of gate lines is provided with a same scanning signal.

3. The thin film transistor array panel of claim 2, wherein a polarity of a voltage applied to the first data line is opposite to a polarity of a voltage applied to the second data line, and a polarity of a voltage applied to the third data line is opposite to a polarity of a voltage applied to the fourth data line.

4. The thin film transistor array panel of claim 3, wherein:
a respective one of the transistors is formed between the first data line and the second data line in each pixel having the respective transistor connected to the respective first data line, and an extension of the corresponding pixel electrode crosses the respective second data line such that the corresponding pixel electrode is connected to the respective transistor, and
a respective one of the transistors is formed between the fourth data line and the third data line in each pixel having the respective transistor connected to the respective fourth data line, and the extension of the corresponding pixel electrode crosses the respective third data line such that the corresponding pixel electrode is connected to the respective transistor.

5. The thin film transistor array panel of claim 4, wherein:
each pixel electrode includes a first pixel electrode and a second pixel electrode,
each transistor includes a first transistor and a second transistor,
for pixels having their transistor connected to the respective first data line, an extension of each first pixel electrode crosses the respective second data line such that each pixel electrode is connected to the drain electrode of the respective first transistor, an extension of each second pixel electrode crosses the respective second data line such that each pixel electrode is connected to the drain electrode of the respective second transistor,
for pixels having their transistor connected to the respective fourth data line, the extension of each first pixel electrode crosses the respective third data line such that each pixel electrode is connected to the drain electrode of the respective first transistor, and an extension of each second pixel electrode crosses the respective third data line such that each pixel electrode is connected to the drain electrode of the respective second transistor.

6. The thin film transistor array panel of claim 5, wherein each gate line is disposed between the respective first pixel electrode and the respective second pixel electrode.

7. The thin film transistor array panel of claim 1, wherein a polarity of a voltage applied to the first data line is opposite to a polarity of a voltage applied to the second data line, and wherein a polarity of a voltage applied to the third data line is opposite to a polarity of a voltage applied to the fourth data line.

\* \* \* \* \*